US007696065B2

United States Patent
Sato et al.

(10) Patent No.: US 7,696,065 B2
(45) Date of Patent: Apr. 13, 2010

(54) METHOD OF MANUFACTURING A SEMICONDUCTOR DEVICE BY FORMING SEPARATION REGIONS WHICH DO NOT EXTEND TO THE PERIPHERALS OF A SUBSTRATE, AND STRUCTURES THEREOF

(75) Inventors: Nobuhiko Sato, Sagamihara (JP); Shigeru Kido, Yokohama (JP); Kazutaka Momoi, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 304 days.

(21) Appl. No.: 11/222,895

(22) Filed: Sep. 8, 2005

(65) Prior Publication Data

US 2006/0049487 A1    Mar. 9, 2006

(30) Foreign Application Priority Data

Sep. 8, 2004    (JP)    ............... 2004-261567

(51) Int. Cl.
*H01L 21/30*    (2006.01)
*H01L 21/46*    (2006.01)
(52) U.S. Cl. .............. 438/458; 257/E21.568; 257/E21.57
(58) Field of Classification Search .......... 257/E21.568, 257/E21.57; 438/458
See application file for complete search history.

(56) References Cited

U.S. PATENT DOCUMENTS

| 6,191,007 | B1* | 2/2001 | Matsui et al. ............... 438/459 |
| 6,426,274 | B1* | 7/2002 | Tayanaka ..................... 438/458 |
| 6,429,095 | B1* | 8/2002 | Sakaguchi et al. ........... 438/458 |
| 6,566,235 | B2  | 5/2003 | Nishida et al. |
| 6,624,047 | B1* | 9/2003 | Sakaguchi et al. ........... 438/458 |
| 6,774,010 | B2* | 8/2004 | Chu et al. .................... 438/458 |
| 2004/0067621 | A1* | 4/2004 | Yanagita et al. ............. 438/455 |
| 2004/0082148 | A1* | 4/2004 | Maleville .................... 438/455 |
| 2004/0206444 | A1* | 10/2004 | Letertre et al. .............. 156/182 |
| 2005/0176222 | A1* | 8/2005 | Ogura ........................ 438/514 |
| 2005/0221583 | A1* | 10/2005 | Aspar et al. ................. 438/458 |

FOREIGN PATENT DOCUMENTS

| EP | 1059663 A2 | 12/2000 |
| JP | A05-218365 | 8/1993 |
| JP | A09-312349 | 12/1997 |
| JP | A2000-349066 | 12/2000 |
| JP | A2001-284622 | 10/2001 |
| JP | A2002-141327 | 5/2002 |
| JP | A2002-231909 | 8/2002 |
| JP | A2002-231912 | 8/2002 |

OTHER PUBLICATIONS

"Mechanism of Pore-Enlargement in Double Porous Si Layers," by K. Sakaguchi et al., Electrochemical Society Proceedings, vol. 2000-25, pp. 318-325.
"Bonding of silicon wafers for silicon-on-insulator," by W.P. Maszara et al., J. Appl. Phys. 64 (10), Nov. 15, 1988, pp. 4943-4950.

* cited by examiner

*Primary Examiner*—Matthew C Landau
*Assistant Examiner*—Daniel Luke
(74) *Attorney, Agent, or Firm*—Canon U.S.A., Inc. IP Division

(57) ABSTRACT

A semiconductor device manufacturing method is disclosed. A semiconductor substrate having a separation region and a semiconductor region which covers the separation region entirely is prepared. One or a plurality of circuit elements are formed in the semiconductor region. The semiconductor substrate is split at the separation region.

11 Claims, 8 Drawing Sheets

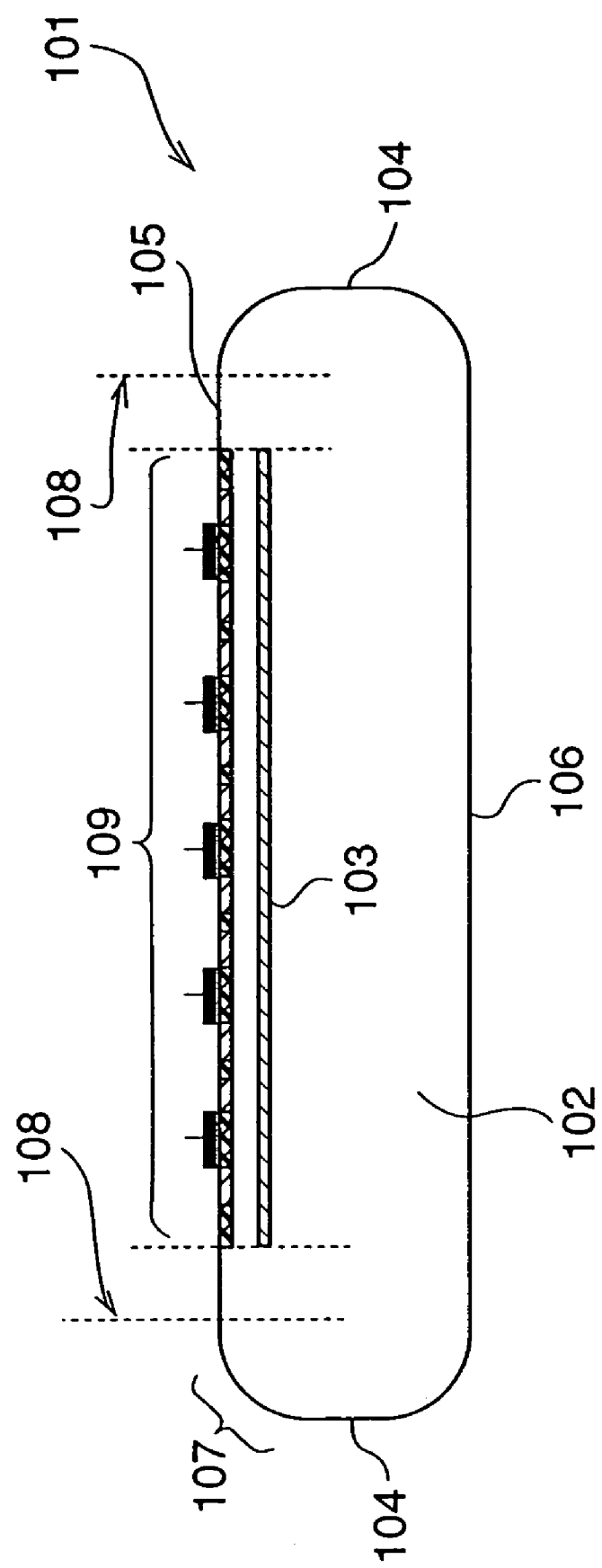

FIG. 5B
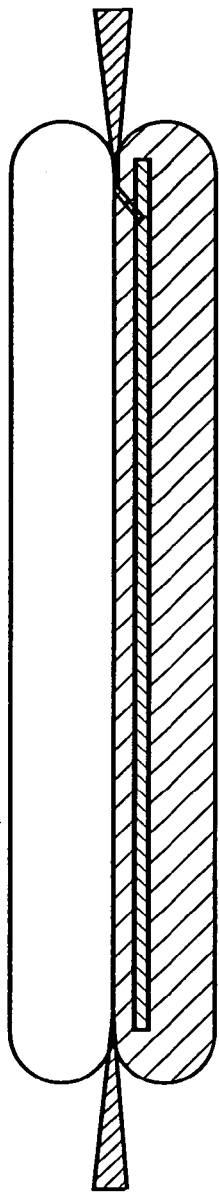
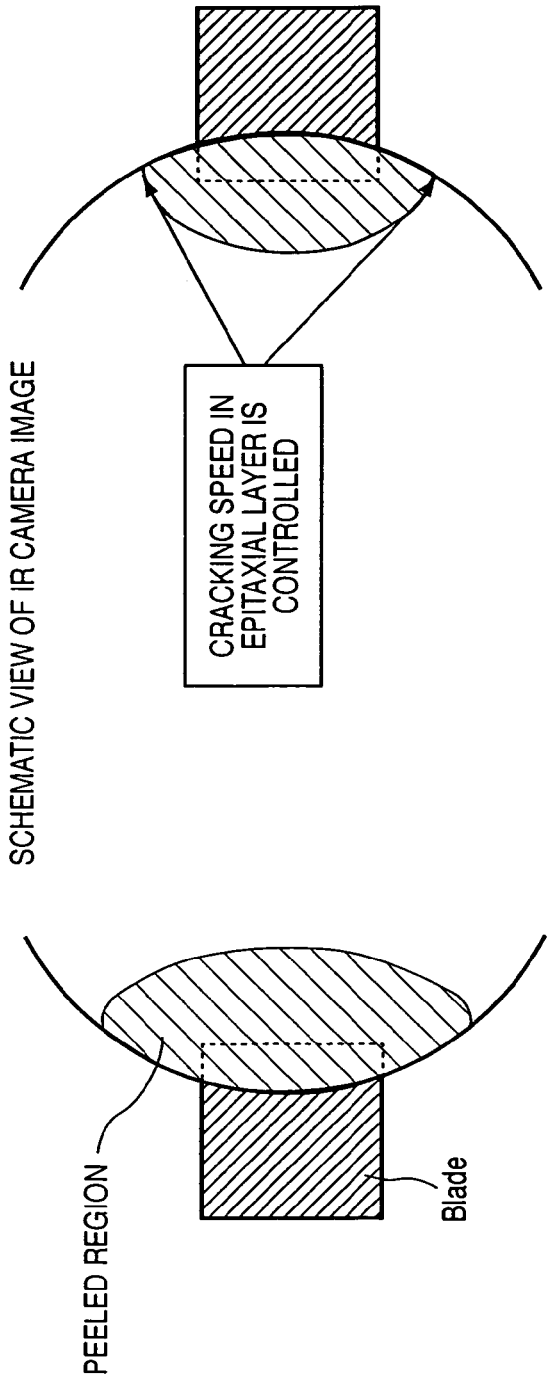

METHOD OF MANUFACTURING A SEMICONDUCTOR DEVICE BY FORMING SEPARATION REGIONS WHICH DO NOT EXTEND TO THE PERIPHERALS OF A SUBSTRATE, AND STRUCTURES THEREOF

FIELD OF THE INVENTION

The present invention relates to a semiconductor device and a method of manufacturing the same.

BACKGROUND OF THE INVENTION

A technique is known in which, to form a thin LSI chip layer, an integrated circuit or the like is formed on a silicon substrate and thereafter formed thin by a grinder from the lower surface side of the substrate. The integrated circuit or the like is formed only on the upper surface of the silicon substrate, and most of the region of the substrate is ground and wasted. With this technique, the resources cannot be used effectively.

As the semiconductor devices shrink in feature size and their integration density increases, the quantity of heat generated by a chip is expected to increase remarkably. Accordingly, to establish a technique for making a thin LSI chip layer is sought for. As an ordinary semiconductor chip lacks flexibility, when it is to be mounted on a thin device such as an IC card, its bending strength must be high. This is because if the ordinary semiconductor chip is to be carried like an IC card, a bending stress sometimes acts on the semiconductor device when putting away the IC card or the like. Accordingly, the LSI chip or the like to be mounted on the thin device also must form a thin layer from the viewpoint of heat radiation and flexibility. As a technique for forming a thin-film semiconductor device, the following ones are disclosed.

According to the thin film forming technique disclosed in Japanese Patent Laid-Open No. 9-312349 (FIGS. 2 to 4), a device is formed on a semiconductor layer formed on the upper surface of a porous layer. The semiconductor layer on which the device is formed is split at the porous layer to form a thin-film semiconductor device or IC card.

According to the thin film forming technique disclosed in Japanese Patent Laid-Open No. 2000-349066 (FIG. 1), the periphery of a semiconductor layer formed on the upper surface of a porous layer is removed so that, when a semiconductor substrate is to be split at the porous layer, cracking does not occur easily.

According to the thin film forming technique disclosed in Japanese Patent Laid-Open No. 2001-284622 (FIGS. 3 and 4), a region where a porous layer is not to be formed is provided on a semiconductor substrate. This prevents a semiconductor layer formed on the surface of a porous material from splitting before it is transferred to a support member side. When the porous layer is exposed to the periphery of the semiconductor substrate, the exposed porous layer is removed.

According to the thin film forming technique disclosed in Japanese Patent Laid-Open No. 2002-141327 (FIGS. 1 to 3), the first porous layer is formed with the first current density on a region, other than the periphery, of the upper surface of a semiconductor substrate. After that, the second porous layer is formed with the second current density on the entire upper surface of the semiconductor surface. Then, a crystal thin film is formed on the region, other than the periphery, of the upper surface of the semiconductor substrate.

According to the conventional thin film forming techniques, one or a plurality of circuit elements are formed on the semiconductor substrate while the porous layer serving as a separation region is exposed. In the circuit element forming step (to be referred to as the "device forming step" hereinafter), the semiconductor substrate may undesirably peel off.

For example, in the invention described in Japanese Patent Laid-Open No. 9-312349 (FIGS. 2 to 4), in the step of forming the device on the semiconductor layer, the periphery of the porous layer is exposed, so that when, e.g., the substrate is to be arranged in an apparatus or transported, the periphery of the substrate may come into contact with the apparatus or a transport member so the semiconductor layer may come off from the porous layer formed in the periphery of the substrate.

In the invention described in Japanese Patent Laid-Open No. 2000-349066 (FIG. 1), the periphery of the porous layer is left exposed since the porous layer is formed until the semiconductor layer is split at the porous layer. Therefore, in the same manner as in Japanese Patent Laid-Open No. 9-312349 (FIGS. 2 to 4), the semiconductor layer may peel off from the exposed porous layer.

In the invention described in Japanese Patent Laid-Open No. 2001-284622 (FIGS. 3 and 4), as the region where the porous layer is not to be formed is provided, the semiconductor layer does not split easily. However, the periphery of the porous layer is left exposed since the porous layer is formed until the semiconductor layer is separated at the porous layer. Therefore, in the same manner as in Japanese Patent Laid-Open No. 9-312349 (FIGS. 2 to 4), the semiconductor layer may peel off from the exposed porous layer.

In the invention described in Japanese Patent Laid-Open No. 2002-141327 (FIGS. 1 to 3), the second porous layer is left exposed since the second porous layer is formed and until the semiconductor layer is split at the first porous layer. Therefore, in the same manner as in the above patent references, the crystal thin film may peel off from the second porous layer formed in the periphery of the substrate.

In this manner, with the prior art, the porous layer is exposed, so that when, e.g., the substrate is to be arranged in an apparatus or transported, the periphery of the substrate may come into contact with the apparatus or a transport member, and unexpected peel-off occurs from the porous layer formed in the periphery of the substrate. If the semiconductor layer peels in the device forming step, the peeled piece may drop onto another semiconductor substrate to cause defective operation of a device located where the peeled piece has dropped, and consequently the chip yield can decrease. If the semiconductor substrate peels, to remove the peeled piece completely, the manufacturing apparatus must be stopped and the components in the apparatus must be cleaned. This decreases the operation efficiency of the device forming step and leads to the need for maintenance steps, thus adversely affecting device formation.

SUMMARY OF THE INVENTION

The present invention has been made in view of the above problems, and has as its object to suppress peel-off in the device forming step.

According to the first aspect of the present invention, there is provided a semiconductor device manufacturing method comprising a step of preparing a semiconductor substrate having a separation region and a semiconductor region which covers the separation region entirely, a step of forming one or a plurality of circuit elements in the semiconductor region, and a step of splitting the semiconductor substrate at the separation region.

According to the second aspect of the present invention, there is provided a semiconductor device manufacturing method comprising a step of preparing a semiconductor substrate having a semiconductor region, a step of forming one or a plurality of circuit elements in the semiconductor region, a step of forming a separation region, which is entirely covered with the semiconductor region, in the semiconductor substrate, and a step of splitting the semiconductor substrate at the separation region.

According to the third aspect of the present invention, there is provided a semiconductor device comprising a separation region, a semiconductor region which covers the separation region entirely, and one or a plurality of circuit elements formed in the semiconductor region, wherein the separation region is formed under a region where at least one or the plurality of circuit elements are to be formed.

According to the present invention, peel-off in the device forming step can be suppressed.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2 is a view showing another semiconductor substrate according to the first preferred embodiment of the present invention;

FIG. 5B includes views schematically showing the image of FIG. 5A;

DETAILED DESCRIPTION OF THE PREFERRED EMBODIMENTS

The present invention provides a semiconductor substrate which is characterized in that a separation region is not exposed in a device forming step, and a method of manufacturing the same. More particularly, the present invention provides a semiconductor substrate which does not peel or split easily in the device forming step but can be split easily in a semiconductor substrate separating step, and a method of manufacturing the same.

Maszara et al disclose a method (to be referred to as a "Maszara method" hereinafter) of measuring adhesion strength which is employed when adhering wafers (see W. P. Maszara, J. Appl. Phys. 64 (1988) p. 4943). More specifically, a blade is inserted from the periphery of an adhered wafer stack and the maximal distance of the peeled region from the blade edge is measured to measure the surface energy serving as the adhesion strength index of the adhesion surface.

By employing the above Maszara method, the present inventors measured the strength necessary for peeling in a wafer having the structure of a single crystal-silicon film/first porous layer/second porous layer (separation region)/single crystal silicon substrate as an example of the structure of a semiconductor film/separation region/substrate. The surface of the above wafer was cleaned, and the wafer was stacked on a silicon wafer. The resultant wafer stack was annealed at 1,000° C. for 2 hrs. Thus, a high bonding strength was obtained. It is confirmed in advance that the semiconductor layer peels off in the separation region prior to the adhesion surface.

Figure 5A:
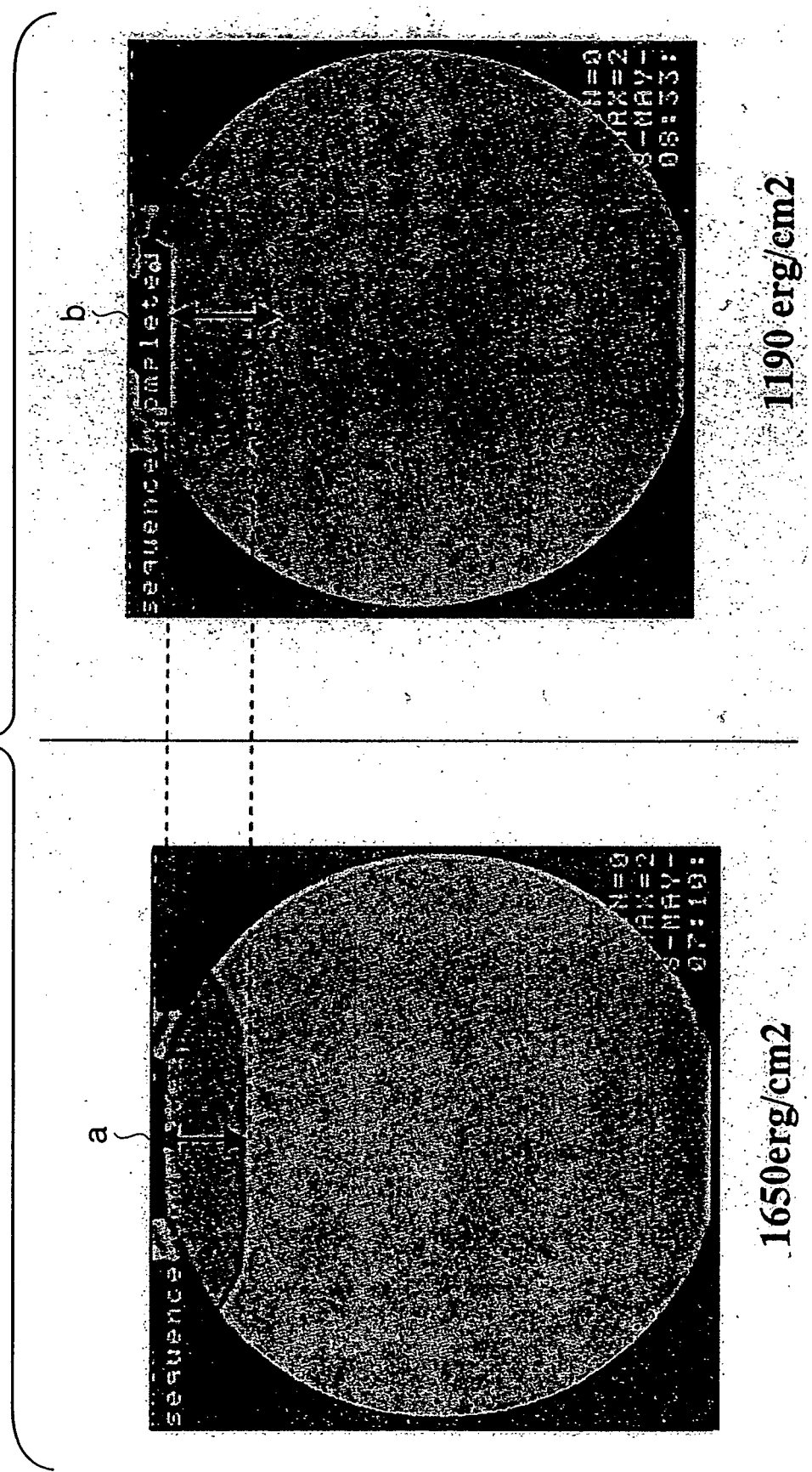
FIG. 5A includes pictures each showing an image obtained by inserting a blade into an adhered wafer stack and observing a peeled region by an infrared camera.

FIG. 5A shows an image obtained by inserting a blade into an adhered wafer stack and observing a peeled region by an infrared camera (reference character "a"). The dark region in FIG. 5A shows the peeled region (reference character "a"). In this case, as the surface energy of the peeled surface formed in the separation region, a value of 1,650 erg/cm$^2$ was obtained according to the calculation formula of the Maszara method. In FIG. 5A, a blade is lightly inserted, near a portion which will form the boundary of the peeled region and unpeeled region, at a position in the wafer outer portion (reference character "b"). The semiconductor layer is allowed to peel off only in the wafer periphery, and thereafter the blade is inserted. When the peeling strength with this scheme was measured, the surface energy of the peeled surface formed in the separation region was 1,190 erg/cm$^2$. The difference in surface energy was analyzed. In the case of FIG. 5A (reference character "a"), when peeling the wafer periphery, the peeled surface must break into the semiconductor film and first porous layer to reach the separation region, as shown in FIG. 5B. As the peeled surface must break into the semiconductor film and first porous layer, the peeled region in the wafer periphery is narrow in FIG. 5A (reference character "a"). Thus, a high surface energy value was measured. In FIG. 5A (reference character "b"), the blade is inserted in advance to break into the semiconductor film and first porous layer, as shown in FIG. 5B. Thus, the surface energy obtained by the above measurement is the surface energy on the peeled surface formed in the separation region. From this experimental result, in the device forming step, assume that the periphery of the substrate comes into contact with another member or the like to expose the separation region. If the peeled surface is formed in the separation region, it need not break into the semiconductor film and first porous layer. The peeled surface can thus be peeled easily when compared to the above case. Consequently, the surface energy of the original peeled surface is measured.

The present invention is based on the above findings, and provides a semiconductor substrate in which the separation region can be prevented from being exposed in the device forming step, and a method of manufacturing the same. A semiconductor substrate according to a preferred embodiment of the present invention comprises a semiconductor region, a separation region formed in the semiconductor region, and one or a plurality of circuit elements formed on the surface of the semiconductor region. The semiconductor substrate has a principal surface which is flat sufficiently so that at least one or the plurality of circuit elements can be formed on it. A semiconductor film and the semiconductor region may be formed by depositing films on the principal surface of the semiconductor substrate, or by modifying the surface layer of the principal surface of the semiconductor substrate. Alternatively, the separation region may be formed under the principal surface of the semiconductor substrate by ion implantation or the like, and the surface layer of the separation region may be formed of a semiconductor film. The semiconductor substrate preferably forms a plate, and more preferably a circular plate. When the semiconductor substrate forms a circular plate, it is called a wafer.

The semiconductor film is desirably formed of a material suitable for formation of one or a plurality of circuit elements. As such a material, a semiconductor such as a IV-group semiconductor, e.g., Si, SiGe, or Ge, a compound semiconductor, e.g., GaAs, InP, or GaN, or a mixed-crystal semiconductor, e.g., InGaAs or HgCdTe can be used. These semiconductors are desirably single crystal semiconductors.

An example of the semiconductor film forming method includes the following (1) and (2).
(1) A method of forming a separation region in a separation region formation region and forming a semiconductor film which covers the separation region by deposition
(2) A method of forming the surface layer of a semiconductor substrate from a semiconductor layer and forming a separation region in the semiconductor substrate In the case of (2), a semiconductor film may be additionally formed. A method of forming the semiconductor film is not particularly limited and, for example, CVD (thermal CVD, plasma CVD, optical CVD, or the like), the MBE method, or the like can be used. When a porous layer is formed by anodizing, prior to growing a semiconductor film on the porous layer, preferably, a protection film forming step of forming protection films such as nitride films or oxide films on the inner walls of pores in the porous material and an annealing step of annealing in a hydrogen-containing atmosphere are performed. The annealing step may be performed after the protection film forming step. After that, a semiconductor film is formed on the porous layer by CVD or the like, and one or a plurality of circuit elements are formed on the semiconductor film with an ordinary semiconductor manufacturing process. The preferred embodiments of the present invention will be described hereinafter.

First Embodiment

FIGS. 1A to 1D are views showing the steps in manufacturing a semiconductor substrate according to the first preferred embodiment of the present invention.

[Formation of Separation Region]

Figure 1A:
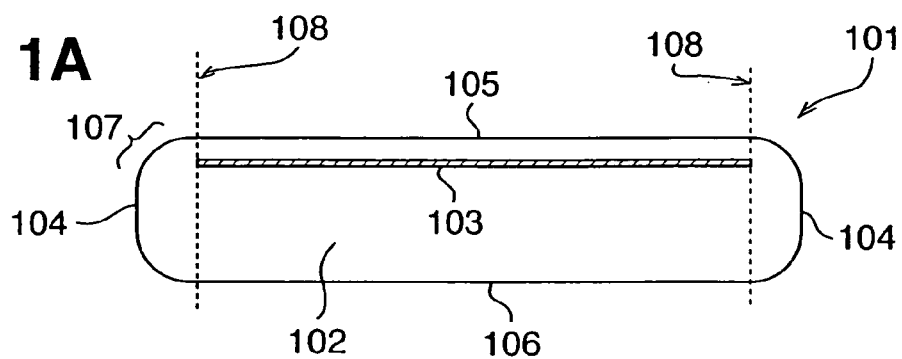
FIGS. 1A to 1D are views showing the steps in manufacturing a semiconductor substrate according to the first preferred embodiment of the present invention.

First, in the step shown in FIG. 1A, a separation region 103 is formed in a semiconductor substrate 101. The semiconductor substrate 101 has a principal surface 105 on which one or a plurality of circuit elements are to be formed, a lower surface 106 located on the lower side of the semiconductor substrate 101, and a periphery 104 located outside an edge 108 of the principal surface 105. The periphery 104 is located outside that edge 108 of the principal surface 105 which is on the contour of the principal surface 105 having a substantially flat surface. A chamfered portion 107 can be formed on the periphery 104 by chamfering. An example of chamfering includes R machining, C machining, and the like, but the present invention is not limited to these methods. The separation region 103 is entirely covered with a semiconductor region 102 and not exposed outside. The separation region 103 is formed in the vicinity of and below the principal surface 105 of the semiconductor substrate 101. Accordingly, the periphery 104 of the semiconductor substrate 101 is where no separation region is formed. The separation region 103 is where a portion which is different from the semiconductor region 102 in the structure, composition, defect density, and the like is formed prior to the separation step, such that when an external force or energy is applied to it in the separation step which is performed after the device is formed on the semiconductor substrate 101, the semiconductor region 102 peels off first. An example of the separation region 103 includes (1) a porous layer, (2) a high defect density layer, (3) a strain accumulated layer, and (4) a layer having different physical characteristics. The fabrication method, structure, composition, and the like of these layers are not particularly limited, and can be exemplified by the following (1) to (4).

(1) Porous Layer

A porous layer is a layer obtained by forming microcavities in a semiconductor layer like a sponge. The porous layer may have a multilayer structure and a specific layer in the porous layer may serve as a separation region. An example of a method of forming a porous layer includes anodizing, stain etching, rare gas (hydrogen, helium, or the like) ion implantation, and microcavity formation by annealing. As an example of the method of forming a porous layer, a method of rendering a silicon substrate porous to form porous silicon will be described. The method of forming porous silicon is not particularly limited and, for example, anodizing is suitably employed. When the principal surface of the silicon substrate is to be rendered porous by anodizing, the following method is basically employed.

First, the silicon substrate is dipped in a solution containing hydrogen fluoride (HF). The solution on the principal surface side of the silicon substrate is electrically insulated from the solution on the lower surface side of the silicon substrate. A DC power supply is connected between the two solutions and a current is supplied such that the principal surface of the silicon substrate serves as an anode. At this time, the solution on the principal surface side of the silicon substrate is an anodizing solution, and the solution on the lower surface side of the silicon substrate is a conductive liquid. An electrochemical reaction takes place to generate hydrogen. Thus, a surfactant such as alcohol may be added to allow hydrogen to desorb easily. The type of conductive liquid is not particularly limited as far as a current can flow through it. In the case of a silicon substrate, a surface oxide readily forms. Thus, a solution containing hydrogen fluoride that etches the surface oxide is suitably used. When the current is supplied, that portion of the silicon substrate which is exposed to the principal-surface-side solution forms a porous layer. The structure of the porous layer can be changed by changing the solution composition, the current density, the conductivity type or the specific resistance of the substrate, and the like. A current channel may be reserved on the lower surface side of the silicon substrate by directly bringing it into contact with an electrode material, as well as using a conductive liquid. If a Shottky barrier is present on the lower surface side of the silicon substrate, the current does not flow easily. To prevent this, a $p^+$ layer or $n^+$ layer is preferably formed on the lower surface of the silicon substrate.

(2) High Defect Density Layer

A high defect density layer is a layer into which crystal defects such as misfit dislocations or edge dislocations have been introduced with a higher density than in other regions. A dangling bond of the semiconductor substrate is present in a crystal defect portion, and accordingly this portion splits more easily when an external force or the like is applied to it. An example of a method of fabricating a high defect density layer includes a method of focusing a stress caused by the lattice constant difference on the interface of a heteroepitaxial layer and substrate by heteroepitaxial growth to introduce misfit dislocations. In the case of heteroepitaxial growth, for example, the following method can be used. More specifically, a 50-nm thick SiGe layer (with a Ge content of, e.g., 20%) is formed on an Si substrate, and thereafter the SiGe layer which is formed on the outer portion of the semiconductor substrate is removed by etching to form a portion where a separation region is not to be formed. The portion where the separation region is not to be formed may be formed by covering the periphery of the semiconductor substrate with a mask and etching the semiconductor substrate, or by supplying an etching liquid to only the periphery of the semiconductor substrate by a single-wafer-spinning wet etching apparatus to etch the semiconductor substrate. Subsequently, an Si layer is epitaxially grown on the entire surface of the semiconductor substrate, and one or a plurality of circuit elements are formed on the Si layer.

Alternatively, ions may be implanted in the semiconductor substrate to introduce crystal defects in the vicinity of the projection ranges of the implanted ions. Although formation of the separation region by means of ion implantation is preferably performed prior to formation of the semiconductor film, it may be performed after formation of the semiconductor film.

When ion implantation is to be performed prior to device formation, an ion-implanted layer is formed to a predetermined depth from the surface of the semiconductor substrate. As the ion type to be implanted, hydrogen or helium is suitable. If the ion dose is large, sometimes a peeling phenomenon occurs in the device forming step due to annealing. Therefore, the dose is desirably set small so that peeling does not occur during the device forming step. Prior to the ion implantation, in order to prevent channeling, an amorphous film such as a thermal silicon oxide film is desirably formed on the surface of the semiconductor substrate. In an ion implantation apparatus, this method is realized by designing the shape of a jig that holds the semiconductor substrate such that ions will not be implanted in the periphery of the semiconductor substrate. Ion implantation may be prevented in the periphery of the semiconductor substrate by controlling the scan region of the ion beam in ion implantation. Also, ion implantation may be performed after a film thicker than the projected range of ion implantation is formed on the periphery of the semiconductor substrate.

If ion implantation is to be performed after device formation, when necessary, a protection film is formed on the surface(s) of one or a plurality of circuit elements formed on the surface of the silicon substrate (or epitaxial semiconductor substrate), and thereafter ions such as hydrogen ions are implanted to a predetermined depth to form an ion-implanted layer which serves as a separation region. In this manner, the separation region can be formed by performing ion implantation after device formation.

(3) Strain Accumulated Layer

A strain accumulated layer is the interface of layers having different lattice constants, or a layer having a different lattice constant from that of a semiconductor substrate. As in the high defect density layer described above, if defects such as misfit dislocations are introduced, the strain will be released. If the layer is so thin that no defects will be introduced, a strain caused by a difference in lattice constant is accumulated in the layer. When a peeling force is applied to the separation surface, this strain accumulated layer splits first because of the accumulated strain. An example of a method of fabricating a strain accumulated layer includes heteroepitaxial growth. In this case, the film thickness is set to be equal to or less than a critical film thickness that allows misfit dislocations to be introduced. Porous silicon has a large surface area, and its lattice constant is different from that of silicon by about $10^{-3}$ to $10^{-4}$ due to the surface tension, the oxide films formed on the inner walls of the pores, or hydrogen absorbed by the pore walls. Therefore, porous silicon is suitable as the material of the strain accumulated layer when the semiconductor substrate is made of silicon.

(4) Layer Having Different Physical Characteristics

For example, a layer having different physical characteristics is a layer having a different thermal expansion coefficient, thermal conductivity, absorbance, specific heat, or the like. An example of a method of fabricating a layer having different physical characteristics includes a method of depositing SiGe on Si or a GaN film on a sapphire substrate. In the former case, the thermal conductivity is different. In the latter case, the absorbance is different. Splitting at the separation region utilizes this difference in physical characteristics. If the absorbance is different, the temperature rise speed upon light irradiation is different, and accordingly a change in thermal expansion amount occurs between the substrate and separation region. In other words, an internal stress is focused in the vicinity of the interface of the substrate and separation region and this layer splits more easily than the rest of the stack.

[Separation Region Formation Region]

A separation region formation region will be described. According to a preferred embodiment of the present invention, a separation region formation region is defined so the separation region will not be exposed at the edge of the semiconductor substrate. Unexpected peeling in the device forming step is mainly caused when the edge of the semiconductor substrate comes into contact with the apparatus or transporting member, when the semiconductor substrate is to be set in the apparatus or transported, to cause peeling from the separation region exposed to the edge of the semiconductor substrate. If the separation region is not exposed at the edge of the semiconductor substrate, a layer above the separation region serves as a peeling preventive film.

According to this embodiment, a separation region is not provided to the edge of the semiconductor substrate that can come into contact with the apparatus or transporting member, but is under that region (to be referred to as the "element formation region" hereinafter) of the principal surface of the semiconductor substrate, that should be originally separated, where one or a plurality of circuit elements are to be formed. Therefore, usually, no device is formed at, of the principal surface of the semiconductor substrate, a region which is at about 1 mm to 3 mm from the outer edge of the semiconductor substrate. This is due to the following reason. When the semiconductor substrate is to be held in the device forming step, this region is not suited to device formation because a jig may come into contact with the periphery of the semiconductor substrate, or because the flatness of the periphery of the semiconductor substrate is not good.

As described above, to fabricate the separation region, the surface layer of the semiconductor substrate may be modified, crystal defects may be introduced into the semiconductor substrate, ions may be implanted from the surface of the semiconductor substrate, strain may be accumulated in the semiconductor substrate, or a film having different physical characteristics may be deposited on the semiconductor substrate. An example of a method of defining the separation region formation region includes the following methods (1) to (3).

(1) An anodizing solution should not come into contact with a porous layer non-formation region, but should come into contact with a porous layer formation region. As a method for this, for example, the following methods (a) and (b) are available.

(a) A porous layer non-formation region is covered by a constituent component in an anodizing apparatus, and a porous layer forming region is exposed to the anodizing solution. In this case, the non-formation region may be covered with a hydrogen fluoride-resistant resin (fluorine-based resin) or fluorine-based rubber, or with a material that does not dissolve in the anodizing solution. The formation region and non-formation region may be limited by the atmospheric pressure.

(b) An anodizing preventive film is formed on the porous layer non-formation region, and the porous layer formation region is exposed to the anodizing solution. For example, an SiN film is formed by thermal CVD. The SiN film is removed only from those regions of the lower and principal surfaces of the substrate where anodizing layers are to be formed. The anodizing preventive film can be a silicon surface layer having a different conductivity type or specific resistance as well as an SiN film, resist, or $SiO_2$ film. In this case, regarding the combination of the anodizing region and non-anodizing region, the non-anodizing region may be set to be made of a material which is not anodized easily as compared to the anodizing region based on the following anodizing easiness.

Anodizing Easiness $$p+>p->n+>n-$$

(the farther to the left side, the easier anodizing is)

Note that + and − indicate the magnitude of the conductivity.

(2) After the porous layer is formed, the porous layer in the porous layer non-formation region is removed to leave the porous layer in the porous layer formation region. This method can apply not only to a porous material but also a separation region which is formed by another method.

Figure 4:
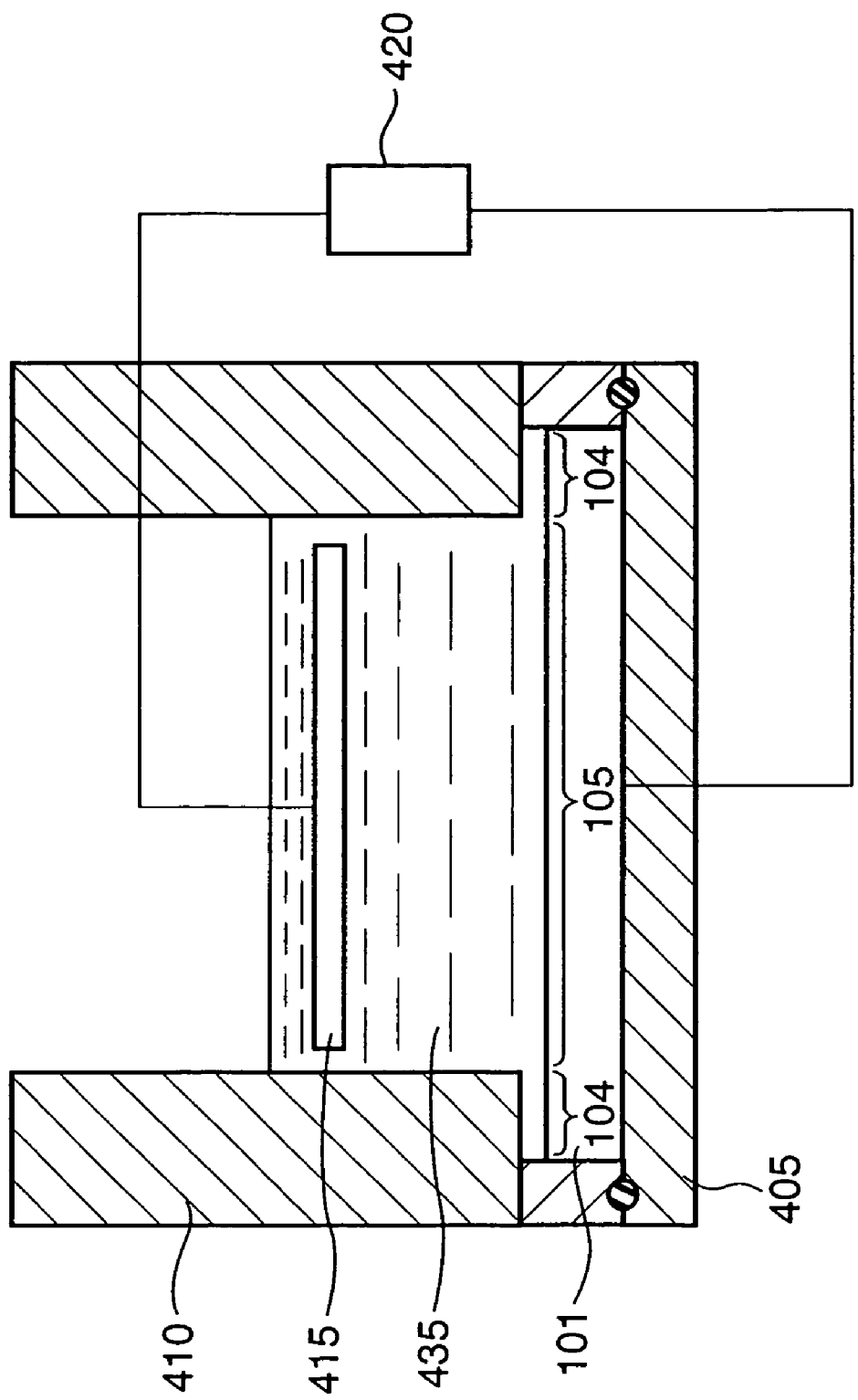
FIG. 4 is a view showing the schematic structure of an anodizing apparatus.

(3) When a plurality of porous layers are formed, of the plurality of porous layers, layers excluding the porous layer closest to the surface of the semiconductor substrate which is appropriate to formation of the semiconductor layer form a separation region. When the porous layers include at least two layers including the first porous layer and the second porous layer located under the first porous layer and suitable for separation, the second porous layer serves as the separation region, and a region where the second porous layer is not formed serves as a region where the separation region is not to be formed. In other words, the first porous layer may be formed at that region in the periphery of the semiconductor substrate where the separation region is not to be formed. For example, this structure can be formed by decreasing the current density during anodizing of the region where the separation region is not to be formed to be smaller than that in the region where the separation region is to be formed. For example, FIG. 4 is a view showing the schematic structure of such an anodizing apparatus. An anodizing tank 405 of the anodizing apparatus can be made of a material (e.g., ethylene tetrafluoride resin) which is resistant to an electrolyte solution 435. The substrate 101 as the processing target is arranged in the anodizing tank 405. The surface of the substrate 101 is divided into the region (principal surface) 105 where the separation region is to be formed and the region (periphery) 104 where the separation region is not to be formed. An electrode 415 is arranged to oppose the region 105 where the separation region is to be formed. An insulating member 410 is arranged to oppose the region 104 where the separation region is not to be formed. Preferably, the insulating member 410 and the region 104 where the separation region is not to be formed are arranged such that the distance between them is smaller than the distance between the electrode 415 and the region 105 where the separation region is to be formed.

Figure 6:
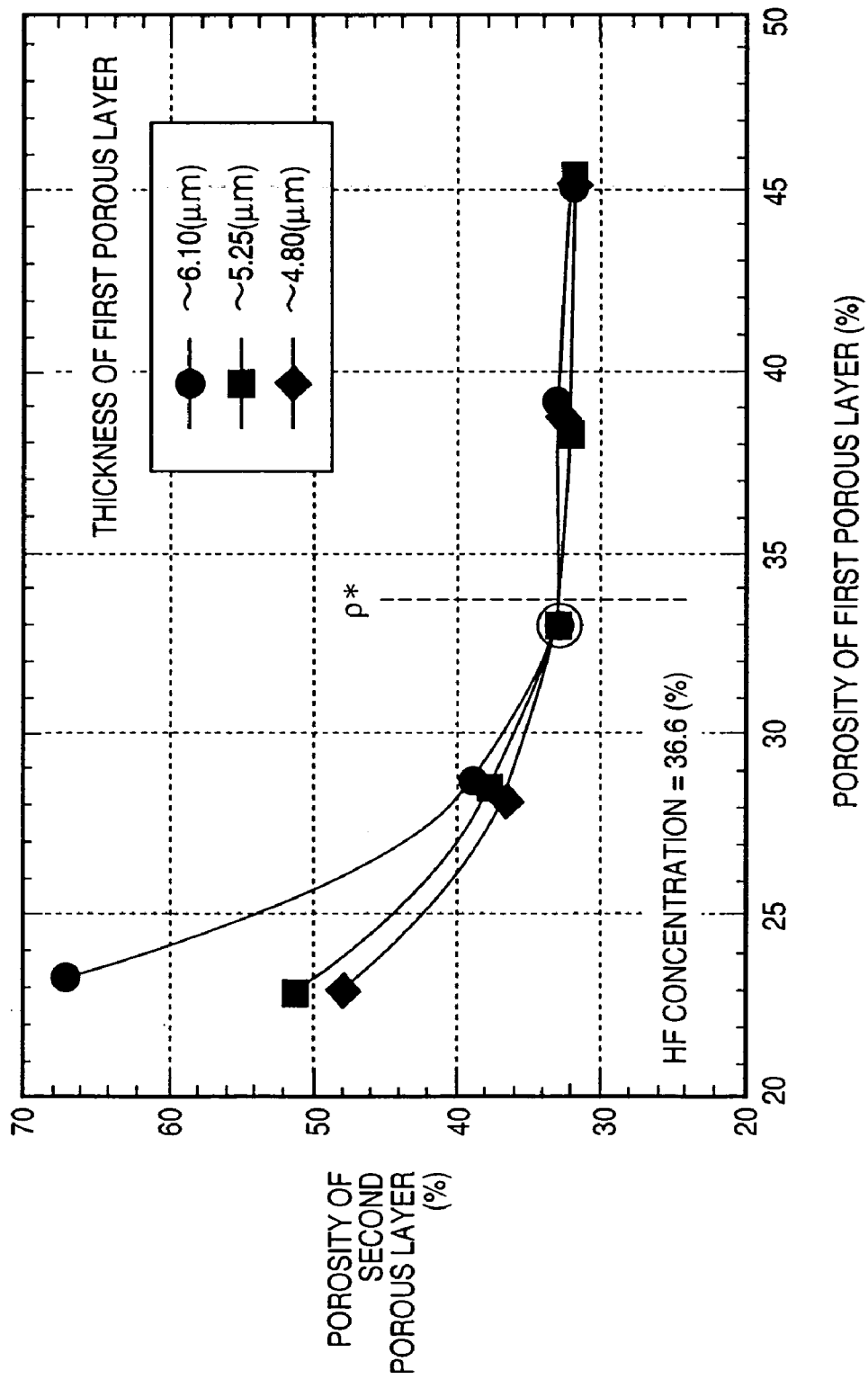
FIG. 6 is a graph showing the relationship between the porosities of the first and second porous layers by using the thickness of the first porous layer as a parameter.
Figure 7A:
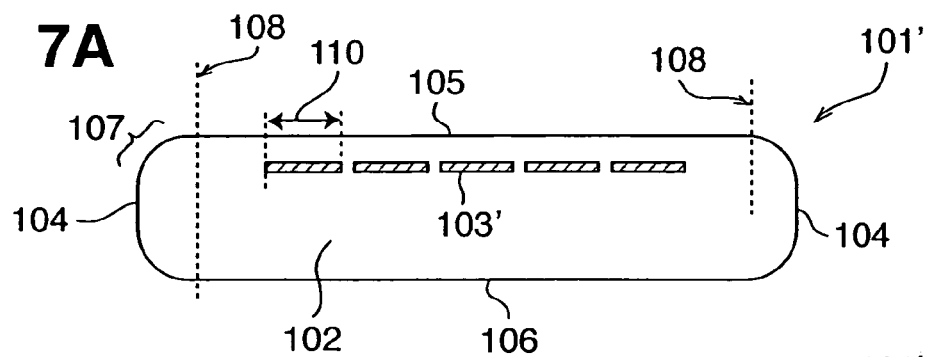
FIGS. 7A to 7D are views showing the steps in manufacturing a semiconductor substrate according to the second preferred embodiment of the present invention.
Figure 7B:
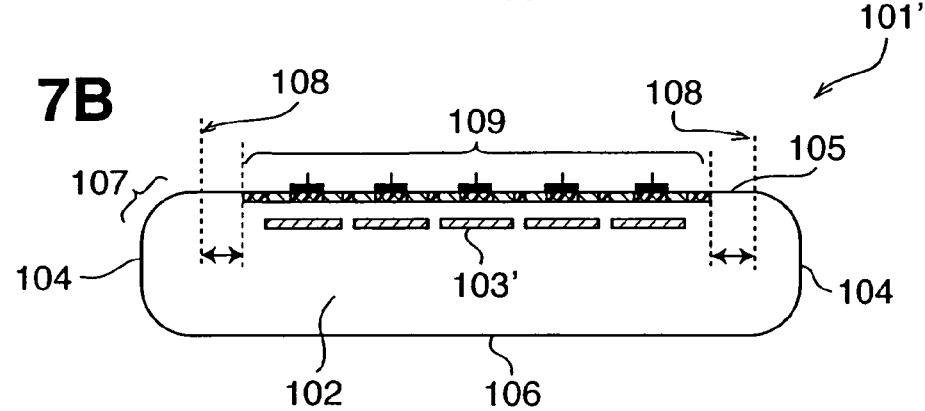
Figure 7C:
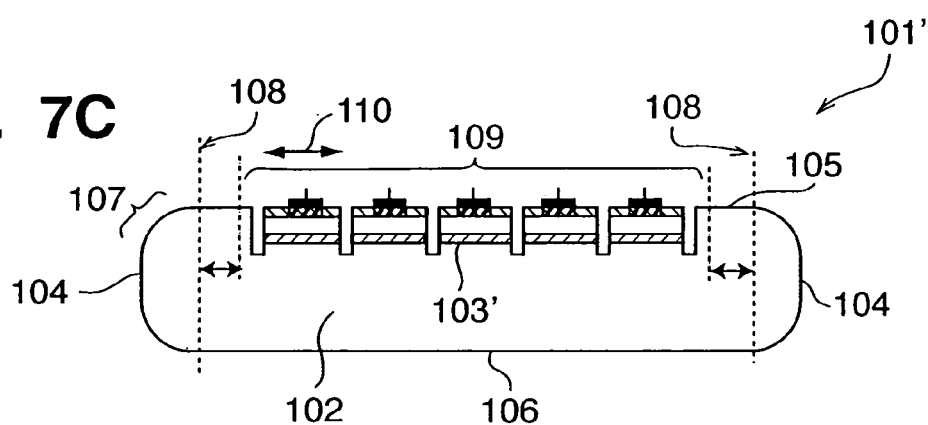
Figure 7D:
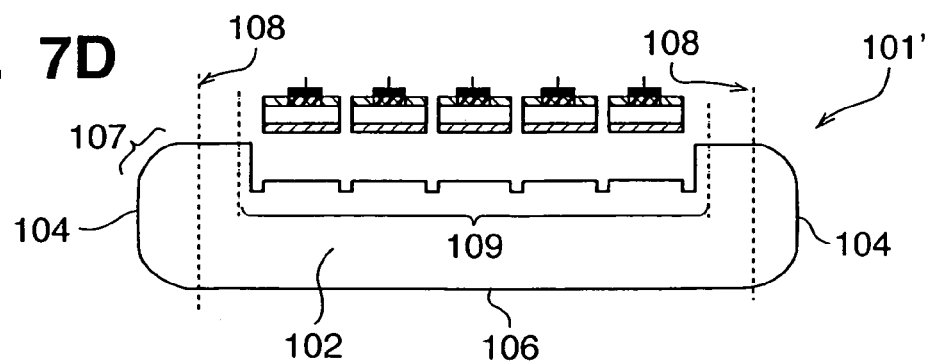

According to the report (p. 318-) (Title: "Mechanism of Pore-Enlargement in Double Porous Si Layers") by Sakaguchi et al appearing in Pits and Pores II: Formation Properties and Significance for Advanced Materials, P. Schunki, D. J. Lockwood, Y. H. Ogata, H. S. Isaacs, PV 2000-25, Phoenix, Ariz., Fall 2000, as the thickness of the first porous layer increases, the porosity of the second porous layer increases, as shown in FIG. 6. When the current density is decreased, the thickness of the porous layer decreases. Therefore, with the above setting, in the region where the separation region is not to be formed, the thickness of the first porous layer decreases. It is known that in most cases the higher the porosity of the porous layer, the higher the separability obtained by the separation region. More specifically, if the current density distribution is set as described above, in the region where the separation region is not to be formed, the second layer with a lower porosity than in the region where the separation region is to be formed is formed. When the current density distribution, hydrogen fluoride concentration, and the like are appropriately set, in the region where the separation region is not to be formed, the second porous layer which substantially serves as the separation region is not formed.

The material of the semiconductor substrate 101 is not particularly limited, but one which can withstand annealing or the like in the semiconductor element forming step is desirable. An example of such a material includes a semiconductor such as (1) a IV-group semiconductor, e.g., Si, SiGe, or Ge, a compound semiconductor, e.g., GaAs, InP, or GaN, and a mixed-crystal semiconductor, e.g., InGaAs, or HgCdTe, (2) an insulator such as silica, quartz, glass, or sapphire, and (3) a metal such as stainless steel. As such a semiconductor, not only a single crystal semiconductor fabricated by the CZ scheme, MCZ scheme, or FZ scheme, but also a semiconductor the surface of which is annealed in hydrogen, a semiconductor formed by epitaxial growth, or the like can be used.

[Formation of Circuit Element]

Figure 1B:
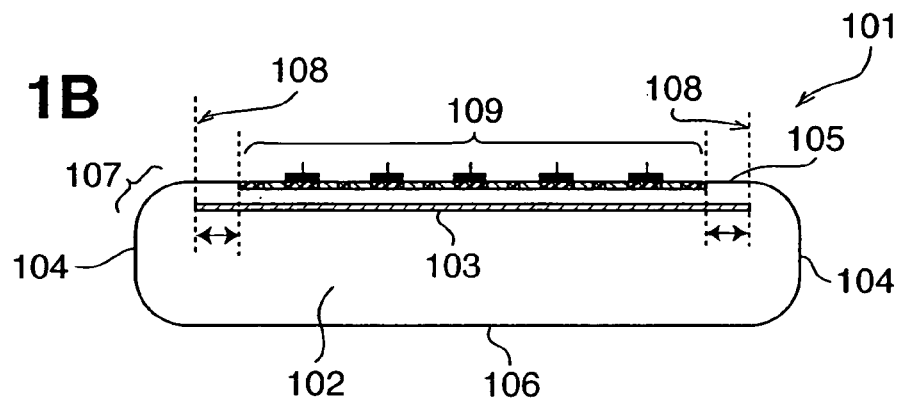
Figure 3B:
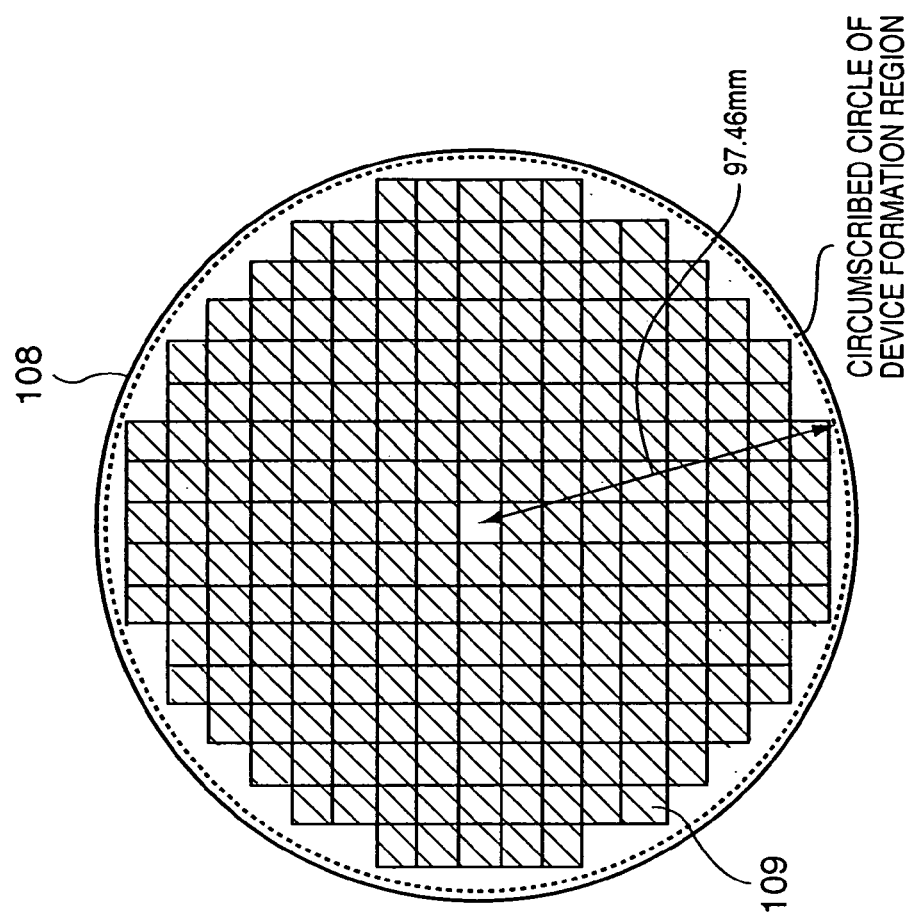
FIGS. 3A and 3B are views showing the relationship between an exposure region and the edge of principal surface of the semiconductor substrate.
Figure 3A:
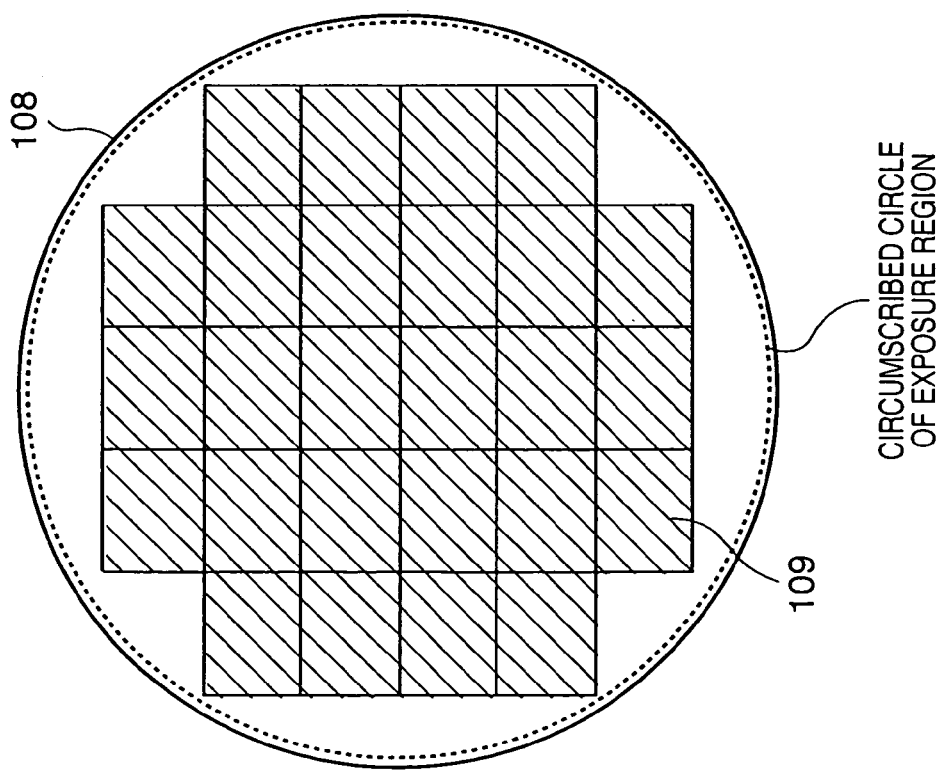

In the step shown in FIG. 1B, one or a plurality of circuit elements are formed in the semiconductor region 102 of the semiconductor substrate 101. One or the plurality of circuit elements are formed in an exposure region (element region) 109 of the semiconductor substrate 101. FIG. 3A shows the relationship between the exposure region 109 and the edge 108 of the principal surface of the semiconductor substrate 101. The exposure region 109 of the exposure apparatus is present inside the edge 108 of the principal surface of the semiconductor substrate 101, and one or the plurality of circuit elements are formed in the exposure region 109. The circumscribed circle of the exposure region 109 is located above the separation region 103 shown in FIG. 1B. The separation region 103 need not always be formed on the entire principal surface of the semiconductor substrate 101, but may be formed in the region outside the exposure region 109 and inside the edge 108 of the principal surface, or below the exposure region 109. Preferably, the separation region 103 is formed immediately under the exposure region 109, as shown in FIG. 2.

The exposure region 109 is printed with the pattern of one or the plurality of circuit elements by a reduction projection exposure apparatus, a one-to-one projection exposure apparatus, or the like called a stepper or scanner. When a stepper is used, the maximal exposure region of one exposure is, e.g., 26×33 $mm^2$. This exposure region is exposed with one exposure mask. In this case, the number of integrated circuits or device chips to be formed in the exposure region 109 is not limited to one, but a plurality of integrated circuits or device chips can be formed in the exposure region 109. For example, when the chip size is 11×11 mm², as shown in FIG. 3A, 2×3=6 chips are exposed collectively, and the exposure region is set to have an area of 22×33 mm². Alternatively, as shown in FIG. 3B, the chips may be sequentially exposed one by one. When the exposure region 109 on the semiconductor substrate 101 is sequentially moved in this manner, exposure regions 109 are formed on the entire surface of the semiconductor substrate 101.

In the vicinity of the edge of the principal surface of the semiconductor substrate, a region where an element or integrated circuit cannot be formed (peripheral excluded region) can be present even on the principal surface of the semiconductor substrate due to the following reasons (1) to (3).

(1) When a semiconductor substrate is to be held in a manufacturing apparatus, it cannot be sufficiently held at its lower surface or periphery. Thus, a jig to hold the semiconductor substrate comes into contact with the upper surface of the semiconductor substrate as well.

(2) The principal surface of the semiconductor substrate has a low flatness in the vicinity of the periphery of the semiconductor substrate, and an exposure target surface cannot be controlled to stay within the depth of focus of the exposure apparatus. Thus, the pattern machining precision is low.

(3) At the periphery of the semiconductor substrate, the uniformity in film formation, etching, ion implantation, and the like of the principal surface of the semiconductor substrate is difficult to ensure.

As a result, a region approximately 2 mm to 5 mm from the outer edge of the semiconductor substrate forms a peripheral excluded region. The peripheral excluded region is a region within the principal surface including the edge of the semiconductor substrate, which is a region within 10 mm, preferably 5 mm, and more preferably 3 mm from the edge of the semiconductor substrate. Preferably, the peripheral excluded region is defined as a region surrounded by the circumscribed circle of an element or integrated circuit formation region and the edge of the principal surface. More preferably, within the principal surface, the separation region is formed in the exposure region of the reduction projection exposure apparatus such as a stepper which is used in element formation, and not formed in the periphery. The region where the element or integrated circuit cannot be formed (peripheral excluded region) refers to such a region where even if an element or circuit element is formed, it does not satisfy the specifications for shipment and cannot operate substantially.

As shown in FIG. 3B, when 11×11 mm chips are arranged, the peripheral excluded region is preferably set to 2.5 mm. Recently, the peripheral excluded region tends to be reduced by eliminating the problems as described above. In any case, a peripheral excluded region is present in the vicinity of the periphery of the principal surface of a semiconductor substrate.

[Exposure of Separation Region]

Figure 1C:
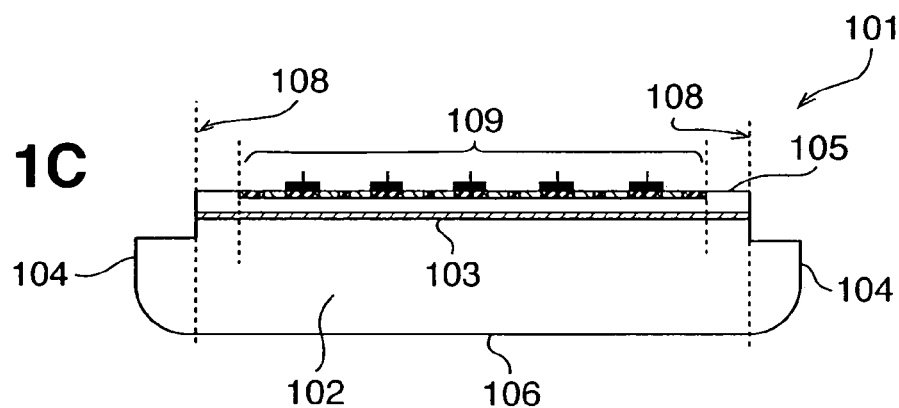

In the step shown in FIG. 1C, the periphery 104 of the semiconductor substrate 101 is removed to expose part of the separation region 103. More specifically, after the device forming step shown in FIG. 1B, the periphery 104 of the semiconductor substrate 101 which is in the region where the separation region 103 is not formed is removed in advance to expose part of the separation region 103. Layers such as a device formation layer which are above the separation region 103 operate as a separation preventive film to suppress peeling. When the separation region 103 is intentionally exposed in the step shown in FIG. 1C, the separation region 103 can exhibit its original separability. The exposure region need not be the entire periphery 104 of the semiconductor substrate 101, and a desired object can be also achieved by exposing only the separation start point. The step shown in FIG. 1C is performed after the device forming step shown in FIG. 1B and before the separating step shown in FIG. 1D.

When part of the periphery of the separation region is exposed in this manner, a film on the separation region such as the semiconductor film as described above need not be broken, so that peeling in the peeling step can be performed easily. The exposing step of the end face of the separation region is not particularly limited. For example, one of the following methods (1) to (3) can be selected as the exposing step.

(1) The outer portion of the semiconductor substrate is ground by a mechanical removing method such as grinding or polishing to expose the separation region.

(2) In a chemical removing method such as etching, particularly, in a method of adhering with the second member and thereafter splitting, etching is performed after adhesion to selectively etch the periphery of the semiconductor substrate.

(3) As another method, laser irradiation or the like can be employed.

[Separation of Semiconductor Substrate]

Figure 1D:
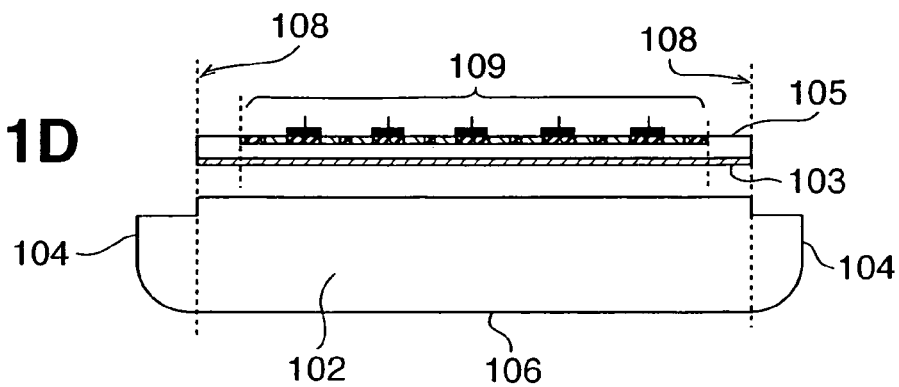

In the step shown in FIG. 1D, the semiconductor substrate 101 is split at the separation region 103. The method of splitting at the separation region 103 is not particularly limited. For example, a method of inserting a solid wedge from the periphery of the semiconductor substrate to peel the semiconductor substrate 101, or a method of applying a fluid pressure to the exposed portion of the separation region 103 at the periphery of the semiconductor substrate can be employed. As an example of the pressure applying method, a liquid or gas fluid is injected as a high-pressure jet to the side surface of the separation region 103, a hydrostatic pressure is applied to the separation region 103, or a fluid wedge is inserted in the separation region 103 from the periphery of the semiconductor substrate. A method of fixing the two surfaces of the semiconductor substrate with a jig or the like and applying tensile forces to the two surfaces to peel the semiconductor substrate may be employed. A vibration energy such as ultrasonic waves may be applied to the separation surface to separate the semiconductor substrate. Alternatively, an internal stress caused by a difference in thermal expansion coefficient between a device formation layer and semiconductor substrate due to heating or cooling may be used to peel the semiconductor substrate.

When splitting is to be performed with a fluid, a liquid such as water, an etching liquid, or alcohol, or a gas such as air, nitrogen gas, or argon gas can be used. When splitting is to be performed under a hydrostatic pressure (under a substantially still fluid), for example, the following pressure application mechanism can be used. More specifically, a closed space constituting member which surrounds at least part of the periphery of a member to constitute a closed space, and a pressure application mechanism which can apply a higher pressure than the external space to the closed space can be used.

If the separation region 103 is fabricated by ion implantation of hydrogen, nitride, helium, or rare gas, when it is annealed at about 400° C. to 600° C., a microbubble layer (microcavity layer) formed by ion implantation agglomerates. In addition to the fluid pressure, this phenomenon can be used to perform splitting. Heating with a $CO_2$ laser may also be employed.

In splitting, a support member may be adhered to the semiconductor substrate 101 through an adhesion layer. The step of adhering to the support member may naturally be omitted. As the adhesion layer, an epoxy-based adhesive or another adhesive can be used. In this case, preferably, the region to be adhered does not include the region where the separation region 103 is not formed. When the separation region 103 is exposed in advance, preferably, the exposed region is not covered with the adhesive.

After the splitting, the semiconductor substrate formed with one or the plurality of circuit elements is diced by a grindstone or laser and formed into chips with desired sizes each corresponding to one or the plurality of circuit elements, so that one or a plurality of thin-film semiconductor devices can be obtained. The distal ends of cutting grooves formed by dicing need not always reach the adhesion layer. If the cutting grooves reach the support member during chip formation, the thin-film semiconductor devices as adhered to the support member can be placed on a package table, and thereafter the support member can be removed. The separation regions left on the thin-film semiconductor devices may be removed when necessary.

After the chip formation, each thin-film semiconductor device can be connected to another circuit or packaged. In other words, the thin-film semiconductor device can be placed on a support base or transferred onto a plastic card. The remaining separation region can form a gettering site to increase the metal contamination resistance in the process. A device layer may be arranged on the upper surface of the package table. A device layer side may be an adhesion surface.

Chip formation performed from the separation region can use etching, laser abrasion, an ultrasonic cutter, a high-pressure jet (e.g., a water jet), or the like in addition to an ordinary dicing apparatus. Chip formation by etching can employ an etching liquid such as $HF+H_2O_2$, $HF+HNO_3$, or alkali solution. As the laser, a YAG laser, $CO_2$ laser, excimer laser, or the like can be used.

The chip forming step may be performed before or after the splitting step. A LOCOS film may be formed between the chips or MESA etching may be performed so that no semiconductor film is present between the chips. In this manner, the member is split at the separation region 103.

While the methods disclosed in Japanese Patent Laid-Open Nos. 5-218365, 2002-231912, 2002-231909, and the like can be employed as the separating step and chip forming step, the present invention is not particularly limited to them.

As described above, a semiconductor substrate according to the preferred embodiment of the present invention can be fabricated with the steps shown in FIGS. 1A to 1D. According to the present invention, exposure of a separation region at the periphery of a semiconductor substrate where a device is not to be formed is excluded. Layers above the separation region serve as a peeling preventive film. Then, in the device forming step, when the substrate is to be set in the apparatus or transported, even if the periphery of the semiconductor substrate comes into contact with the apparatus or a transporting member, unexpected peeling can be suppressed from occurring from the separation region which is accidentally exposed to the periphery of the semiconductor substrate.

After the device is formed, part of the periphery of the semiconductor substrate where the separation region is not formed in advance prior to the splitting step is removed to intentionally expose part of the separation region. Thus, peeling which occurs as the layers such as the device formation layer above the separation region serve as the peeling preventive film is suppressed less. Thus, the separation region can exhibit its original peelability. When unexpected peeling is suppressed, the peelability of the separation region can be further improved.

Second Embodiment

The second preferred embodiment of the present invention will be described. FIGS. 7A to 7D show the steps in manufacturing a semiconductor substrate according to the second preferred embodiment of the present invention. In the step shown in FIG. 7A, separation regions 103' are formed in a semiconductor region 102. The separation regions 103' are not formed in a periphery 104 of a semiconductor substrate 101', in the same manner as in the first embodiment. However, in the step shown in FIG. 7C, the separation regions 103' are not formed in portions to be diced. The second embodiment is different from the first embodiment in this respect. More specifically, the separation regions 103' are formed only below a plurality of chip regions 110 included in a region where one or a plurality of circuit elements are to be formed. In the step shown in FIG. 7B, one or a plurality of circuit elements are formed in the semiconductor region 102. When necessary, the semiconductor substrate 101' is adhered to a support member through an adhesion layer. In the step shown in FIG. 7C, of the semiconductor region 102, regions where the separation regions 103' are not formed are diced to form cutting grooves, thus exposing the separation regions 103' to form chips. Desirably, the distal ends of the cutting grooves reach near the interface between the semiconductor region 102 and the support member or near the adhesion layer. In the step shown in FIG. 7D, microsemiconductor region chips formed from the semiconductor substrate 101' are split at the separation regions 103'.

Thin-film semiconductor devices are formed in this manner. After the semiconductor chips are formed in the splitting step, the splitting area is very small as compared to that in the silicon semiconductor substrate, and accordingly the chips may be split by using an external force such as a tensile force, compression, or shearing, but are desirably split by using the fluid described above. The chips may be split by heating the separation regions. In particular, when the separation regions are formed of an ion-implanted layer implanted with, e.g., hydrogen, they may be locally heated by a laser or the like. Regarding the separation regions, a semiconductor film, the semiconductor substrate, and one or a plurality of circuit elements, the description in the above first embodiment can directly apply.

In this embodiment as well, the separation regions are not formed in the periphery of the semiconductor substrate, so that peeling during the device forming step can be prevented. Regarding the separability in the splitting step, it can be maintained high by forming the cutting grooves to expose the separation regions.

The present invention will be described below based on Examples. Note that the present invention is not limited to these Examples.

Example 1

A p-type single crystal Si semiconductor substrate having a specific resistance of 0.01 Ω·cm and a diameter of 200 mm was prepared. Subsequently, the substrate surface was anodized in a hydrogen fluoride solution to form a porous layer. The anodizing conditions were as shown in Tables 1(a) to 1(c). At this time, a fluorine resin (e.g., a PTFE material) was brought into contact with the semiconductor substrate at a radial position of 98 mm so the porous layer would not be formed in the periphery of the semiconductor substrate. The upper and lower surface sides of the semiconductor substrate were partitioned so the anodizing solutions on the two surface sides would not mix. Thus, the porous layer can be formed only on the surface which is in contact with the anodizing solution on the upper surface side of the semiconductor substrate. The solution on the lower surface side of the semiconductor substrate need not be an anodizing solution as far as it is conductive, and preferably contains hydrogen fluoride because it can remove oxides.

TABLE 1(a)

Anodizing Solution

| | |
|---|---|
| HF | 42% |
| $C_2H_2OH$ | 9% |

TABLE 1(b)

First Porous Silicon Layer

| | | |
|---|---|---|
| Current Density | 16 | $(mA \cdot cm^{-2})$ |
| Time | 2.5 | (min) |
| Thickness of Porous Si Layer | 6 | (μm) |

TABLE 1(c)

Second Porous Silicon Layer

| | | |
|---|---|---|
| Current Density | 30 | $(mA \cdot cm^{-2})$ |
| Time | 0.5 | (min) |
| Thickness of Porous Si Layer | 2 | (μm) |

When the formed porous layer was observed by sectional SEM, with reference to a radial position of 98 mm as a boundary, a porous layer was formed on a side close to the center of the semiconductor substrate, and was not on the side outer than this, and at the periphery and on the lower surface of the semiconductor substrate. The porous layer was obliquely polished and observed by SEM. The pore area was measured to obtain the porosity. The first layer had a porosity of 20% and the second layer had a porosity of 40%. This single crystal Si substrate was oxidized in a 400° C. oxygen atmosphere for 1 hr. The inner walls of the pores of porous Si were thus covered with thermal oxide films. After that, the surface of the porous Si layer was dipped in hydrofluoric acid to remove only the oxide film on the surface of the porous Si layer while leaving oxide films on the inner walls of the pores. A single crystal Si layer was epitaxially grown for 3 μm on the porous Si layer by CVD (Chemical Vapor Deposition). The growing conditions are as shown in Table 2.

TABLE 2

| | |
|---|---|
| Source Gas | $SiH_2Cl_2/H_2$ |
| Flow Rate of Gas | 0.3/40 l/min |
| Pressure of Gas | 80 Torr |
| Temperature | 900° C. |

Prior to the epitaxial growth, annealing was performed in a hydrogen-containing atmosphere. This aims at sealing the surface pores. In addition to this annealing, fine Si atoms may be added by a source gas or the like to supplement atoms for surface pore sealing. The member obtained in this manner can be handled as the same semiconductor substrate as an ordinarily used epitaxial semiconductor substrate. This member is different from the ordinarily used epitaxial semiconductor substrate in that a porous Si layer is formed under the epitaxial layer. Circuits such as a microprocessor, logic IC, and memory were fabricated in this epitaxial layer. In fabrication of the LSI, ordinary steps were employed, so that an LSI having the same performance as that of the conventional LSI could be fabricated. The LSI formed in this manner is formed into chips usually by lower-surface grinding and dicing. Prior to splitting, a grindstone was applied to the periphery of the upper surface of the semiconductor substrate which was outside a radial position of 97.5 mm, and grinding was performed to expose the second porous layer. After that, the entire surface of the semiconductor substrate is split into the substrate side and LSI side at the second porous layer which is fabricated in advance. Splitting was performed utilizing a fluid pressure. More specifically, splitting was performed by injecting a high-pressure water jet to the side surface of the porous Si layer.

As the fluid, the following ones can be used, i.e., a gas, a liquid, or a gas or liquid containing solid granules or powders. Although a water jet (to be referred to as "WJ" hereinafter) was used in Example 1, an air jet, a nitrogen gas jet, another gas jet, a liquid jet other than water, a fluid jet mixed with ice, plastic pieces, or abrasive members can be used, or a hydrostatic pressure of such a jet can be used. According to the characteristic feature of the fluid, the fluid can flow into even a very small gap to increase the internal pressure, so that an external pressure can be applied in a dispersed manner. As the fluid does not apply an extremely high local pressure, it can selectively split a portion that is most susceptible to the pressure. As in the present invention, to split the entire surface of a thin layer on which semiconductor devices have already been fabricated, the fluid is an optimal means. In splitting, the upper surface side is preferably supported by another support member.

For example, an example of another support member includes a flexible sheet, a glass substrate, a plastic substrate, a metal substrate, and another semiconductor substrate. Such a support member is adhered with an adhesive to the upper surface of the substrate on which devices have been formed. A fluid is applied to near the edge of the first substrate supported by the support member to split the porous Si layer with the entire surface. When applying the fluid, porous Si is preferably exposed to the first substrate edge. If the porous Si portion is exposed such that it forms a recess, the fluid pressure can be applied to the porous Si layer more efficiently. Porous Si remaining on the device layer side may or may not be removed. After that, the device layer side was cut into chip sizes by dicing, and the respective chips were packaged. The split surface of each chip may be placed on the package table, and the chip may be wire-bonded from the upper surface side. Alternatively, the chip may be packaged with its surface facing down. When the chip is directly set on a plastic card, an IC card can be fabricated.

Example 2

A p-type single crystal Si semiconductor substrate having a specific resistance of 0.01 Ω·cm and a diameter of 200 mm was prepared. The substrate surface was anodized in a hydrogen fluoride solution to form a porous layer. The anodizing conditions were the same as those shown in Tables 1(a) to 1(c) of Example 1. At this time, a member made of fluorine resin (e.g., a PTFE material) was set outside a radial position of 98 mm of the semiconductor substrate at a position separated from the semiconductor substrate by 0.1 mm. The semiconductor substrate was held at the outer portion of its lower surface by a pad made of fluorine rubber, so the anodizing solution on the upper surface side and that on the lower surface side of the semiconductor substrate would not mix. The pad has concentric grooves. The interiors of the grooves are evacuated to bring the pad into tight contact with the semiconductor substrate.

When the formed porous layer was observed by sectional SEM, with reference to a radial position of 98 mm as the boundary, the first and second porous layers described above were formed on sides close to the center of the semiconductor-substrate. The porous layer was obliquely polished and observed by SEM to measure the pore area. The first layer had a porosity of 20% and the second layer had a porosity of 40%.

On the outer side of this close-to-the-center portion and the periphery of the semiconductor substrate, however, merely a porous layer having substantially the same structure as that of the first porous layer was formed to a thickness of approximately 0.2 µm, and a high-porosity layer corresponding to the second porous layer was not formed. This is due to the following reason. On the outer portion of the semiconductor substrate, as a member was arranged at a position close to the surface of the semiconductor substrate, the current density at this portion was substantially decreased. Thus, the thickness of the first porous layer decreased. Consequently, when forming the second porous layer as well, because the first porous layer was thin, the porosity of the second porous layer did not increase. No porous layer was formed on the lower surface of the semiconductor substrate.

After this, an epitaxial growth layer was formed by the same method as in Example 1 to fabricate a device. The device was adhered to the second support member with an adhesive material. As the support member, a quartz semiconductor substrate was used. Successively, the resultant stack was dipped in a chemical solution of nitric-hydrofluoric acid to remove the device formation layer, epitaxial silicon layer, and the like on the outer portion of the semiconductor substrate, thus exposing the second porous layer. Steps after this were the same as those in Example 1.

Example 3

A p-type single crystal Si semiconductor substrate having a resistivity 14 Ω·cm was prepared. The substrate orientation was <100>. Hydrogen ions were implanted to a predetermined depth (in Example 3, a depth of 3 µm from the upper surface side) from the principal surface side where circuits are to be formed, thus forming an ion-implanted layer. The dose was $1 \times 10^{16}$ to $1 \times 10^{17}/cm^2$. Prior to the injection, an $SiO_2$ protection film may be formed on the uppermost surface by CVD. At this time, that portion of the outer portion of the semiconductor substrate which was outside a radial position of 99 mm was protected with a jig so as not to be irradiated with ions. A circuit formation layer for a microprocessor, logic IC, memory, and the like was fabricated on the upper surface of the single crystal Si substrate. The outer portion of the semiconductor substrate was irradiated with a normal-pressure plasma to etch the device formation layer and single crystal Si layer. The device formation layer and a plastic substrate (or a glass substrate, Si substrate, flexible film, or adhesive tape) serving as the support member were adhered with an adhesive. After that, nitrogen gas was injected to the side surface of the ion-implanted layer to perform the splitting step. The chip forming step was performed in the same manner as in Example 1 to fabricate IC cards.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004-261567 filed Sep. 8, 2004, which is hereby incorporated by reference herein.

What is claimed is:

1. A semiconductor device manufacturing method, comprising:
   a step of preparing a semiconductor substrate, a surface of the semiconductor substrate including a principal surface and a periphery which is located outside an edge of the principal surface and includes a chamfered portion, the semiconductor substrate having an internal separation region formed below the principal surface and within the semiconductor substrate such that the internal separation region continuously extends in a region below the principal surface and does not extend to a region below the periphery, and a semiconductor region which entirely encloses the separation region such that the separation layer is not exposed to an external space of the semiconductor substrate;
   a step of forming one or a plurality of circuit elements in the semiconductor region;
   a step of removing the semiconductor region at a periphery of the semiconductor substrate to expose the separation region; and
   a step of splitting the semiconductor substrate at the separation region.

2. A semiconductor device manufacturing method, comprising:
   a step of preparing a semiconductor substrate, a surface of the semiconductor substrate including a principal surface and a periphery which is located outside an edge of the principal surface and includes a chamfered portion, the semiconductor substrate having a semiconductor region;
   a step of forming one or a plurality of circuit elements in the semiconductor region;
   a step of forming an internal separation region below the principal surface and within the semiconductor substrate such that the internal separation region continuously extends in a region below the principal surface and does not extend to a region below the periphery, the internal separation region being entirely enclosed by the semiconductor region such that the separation layer is not exposed to an external space of the semiconductor substrate;
   a step of removing the semiconductor region at a periphery of the semiconductor substrate to expose the separation region; and
   a step of splitting the semiconductor substrate at the separation region.

3. The method according to claim 1, wherein the separation region comprises a porous layer.

4. The method according to claim 3, wherein the semiconductor substrate has a plurality of porous layers, and the separation region comprises layers obtained by removing from the plurality of porous layers a porous layer which is the closest to a surface of the semiconductor substrate.

5. The method according to claim 1, wherein the separation region is formed by ion implantation.

6. The method according to claim 1, wherein the semiconductor substrate has a plurality of single crystal layers having different lattice constants, and the separation region comprises an interface of the single crystal layers having the different lattice constants.

7. The method according to claim 1, wherein the separation region is formed under a region where at least one or the plurality of circuit elements are to be formed.

8. The method according to claim 1, further comprising, before the step of splitting, a step of bonding the semiconductor substrate to another member.

9. The method according to claim 8, wherein in the step of bonding, a surface of the semiconductor substrate and another member are bonded in a region where the separation region is to be formed.

10. The method according to claim 1, further comprising, before the step of splitting, a step of forming chips from the semiconductor region.

11. The method according to claim 10, wherein a region where one or the plurality of circuit elements are to be formed includes a plurality of chip regions, the separation region is formed under each one of the plurality of chip regions, and in the step of forming chips, of the semiconductor region, a region where the separation layer is not formed is diced to expose the separation region.

* * * * *